Figure 1:
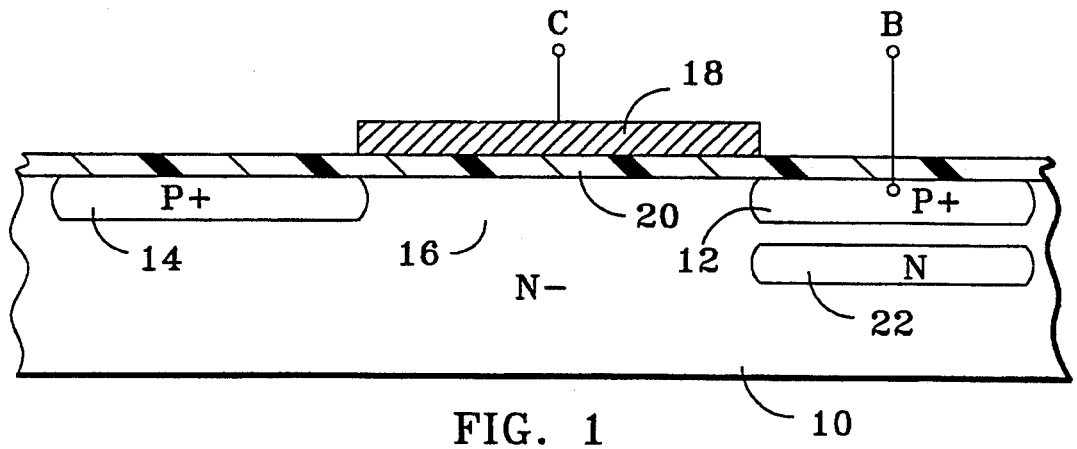

United States Patent [19]
Bakeman, Jr.

[11] Patent Number: 5,347,153
[45] Date of Patent: Sep. 13, 1994

[54] SHORT CHANNEL TRANSISTORS

[75] Inventor: Paul E. Bakeman, Jr., South Burlington, Vt.

[73] Assignee: International Business Machines Corporation, Armonk, N.Y.

[21] Appl. No.: 124,521

[22] Filed: Sep. 20, 1993

Related U.S. Application Data

[63] Continuation-in-part of Ser. No. 874,673, Apr. 27, 1992, abandoned.

[51] Int. Cl.$^5$ .................. H01L 27/01; H01L 29/00
[52] U.S. Cl. ..................... 257/345; 257/346; 257/409
[58] Field of Search ............ 257/344, 345, 408, 346, 257/409

[56] References Cited

U.S. PATENT DOCUMENTS

| | | | |
|---|---|---|---|
| 4,101,922 | 7/1978 | Tihanyi et al. | 357/23 |
| 4,506,436 | 3/1985 | Bakeman, Jr. et al. | 29/577 |
| 4,737,828 | 4/1988 | Brown | 257/346 |
| 4,961,165 | 10/1990 | Ema | 365/182 |

OTHER PUBLICATIONS

IBM Technical Disclosure Bulletin, vol. 21, No. 9, Feb. 1979, pp. 3823 to 3825, "Double Polysilicon Dynamic Random–Access Memory Cell With Increased Charge Storage Capacitance" by V. L. Rideout.

*Primary Examiner*—Jerome Jackson
*Assistant Examiner*—Donald L. Monin, Jr.
*Attorney, Agent, or Firm*—Stephen J. Limanek

[57] ABSTRACT

An improved short channel field effect transistor is provided which includes a semiconductor substrate having a given type dopant with source and drain electrodes, one of the electrodes having a diffusion of the type of dopant opposite to that of the given type dopant, a channel disposed between the source and drain electrodes, a region having the same type dopant as that of the substrate and aligned with the diffusion at the diffusion-channel interface, the region having sufficient dopant to prevent penetration of the depletion region generated by the diffusion into the substrate or at least to significantly limit the electric field which results from the junction between the diffusion and the substrate and an electrically conductive contact made with the diffusion, which may be, e.g., connected to a substantially constant bias or supply voltage source.

17 Claims, 3 Drawing Sheets

SHORT CHANNEL TRANSISTORS

This is a continuation-in-part of copending application(s) Ser. No. 07/874,673 filed on Apr. 27, 1992, now abandoned.

TECHNICAL FIELD

This invention relates to short channel transistors having reduced depletion regions which are particularly useful in high speed logic applications.

BACKGROUND INFORMATION

Many options have been advanced to improve short channel effects or punch through from the drain to the source of a transistor in high speed field effect transistors. Improvements in short channel effects are particularly important in the field of integrated circuit manufacturing as the shortest channel devices limit the speed of the circuit. If the devices can be made shorter and carry more current, they operate faster. The limit to making shorter devices or transistors is the change in threshold voltage that occurs as the distance between the source and drain is reduced.

The use of deep boron implant or "halo" is known for reducing short channel effects. However, such an implant is lightly doped so as to not add capacitance and, hence, decrease switching speeds. Since these implants are not heavily doped, they cannot prevent penetration of the depletion regions of the field effect transistor diffusions into the underlying semiconductor substrate.

In U.S. Pat. No. 4,101,922, issued on Jul. 18, 1978, there is disclosed a doping layer disposed within a semiconductor substrate which overlaps a source electrode of a transistor by a significant distance for controlling the threshold voltage of the transistor with the distance between the channel surface of the transistor and the buried doping layer underneath the gate electrode being critical to the operation of the transistor. Buried doping layers are also disclosed in U.S. Pat. No. 4,506,436, by Paul E. Bakeman, Jr. et al, issued on Mar. 26, 1985 and in U.S. Pat. No. 4,961,165, issued on Oct. 2, 1990. The buried doping layers in these latter two patents are purposely placed deep into the semiconductor substrate so that they do not degrade diffusion capacitance or device substrate sensitivity. In IBM Technical Disclosure Bulletin, Vol. 21, No. 9, February 1979, pages 3823-3825, entitled "Double Polysilicon Dynamic Random-Access Memory Cell With Increased Storage Capacitance" by V. L. Rideout, there is disclosed a self-aligned implant constructed in a double overlapping polysilicon structure for a dynamic random access memory storage cell. The teaching in this article prevents very high levels of doping or doping gradients between the N+ and P+ junctions as a low leakage structure which must support dynamic random access memory node voltages as required in his structure.

DISCLOSURE OF THE INVENTION

It is an object of this invention to reduce the fringing fields which result in the vicinity of the source or drain electrode or structure, more frequently the source electrode, of a short channel, generally less than 0.5 microns, field effect transistor which reduce the transistor's threshold voltage as the spacing between the source and drain electrodes is reduced.

In accordance with the teachings of this invention, an improved short channel field effect transistor is provided which includes a semiconductor substrate having a given type dopant with source and drain electrodes, one of the electrodes having a first region, e.g., a diffusion, of the type of dopant opposite to that of the given type dopant, a channel disposed between the source and drain electrodes, a second region having the same type dopant as that of the substrate and aligned with the first region at the first region-channel interface, the second region having sufficient dopant to prevent penetration of the depletion region generated by the first region into the substrate or at least to significantly limit the penetration of the electric field which results from the junction between the first region and the substrate and an electrically conductive contact made with the first region which may be, e.g., from a substantially constant bias or supply voltage source applied to the first region.

The foregoing and other objects, features and advantages of the invention will be apparent from the following more particular description of the preferred embodiment of the invention, as illustrated in the accompanying drawings.

BRIEF DESCRIPTION OF THE INVENTION

Figure 2:
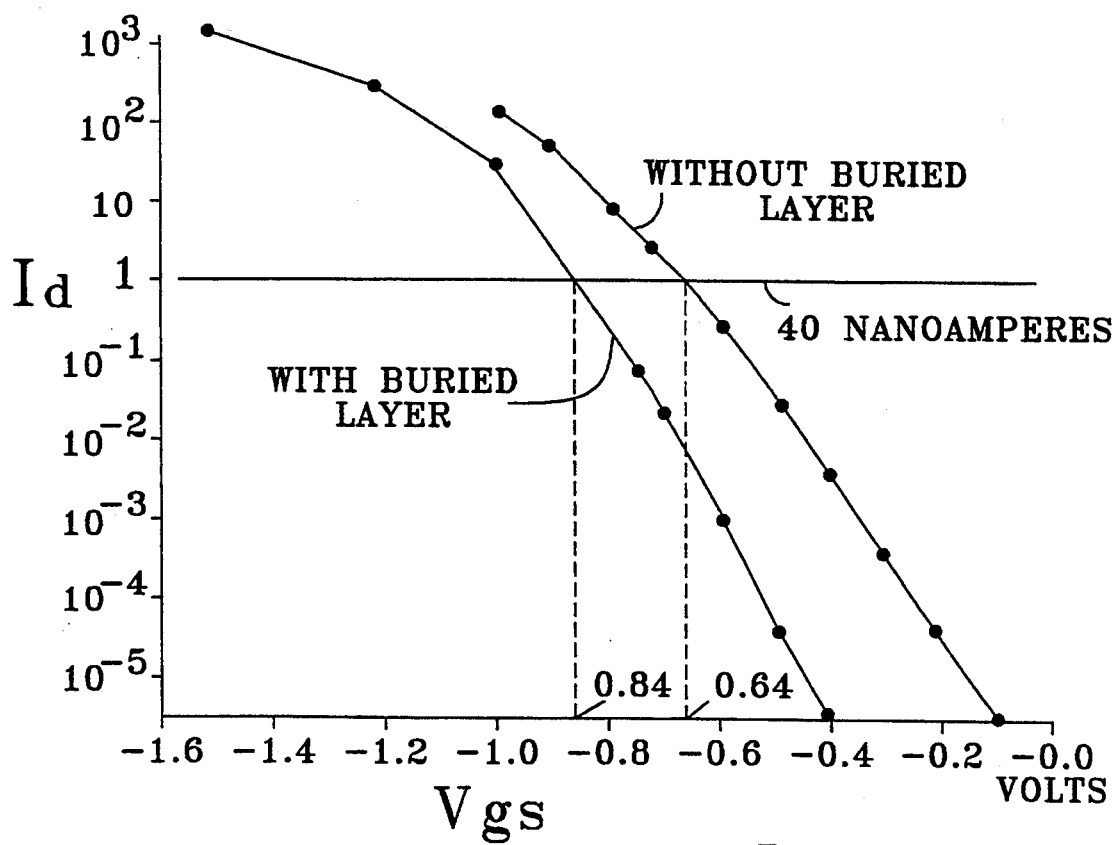
Figure 3:
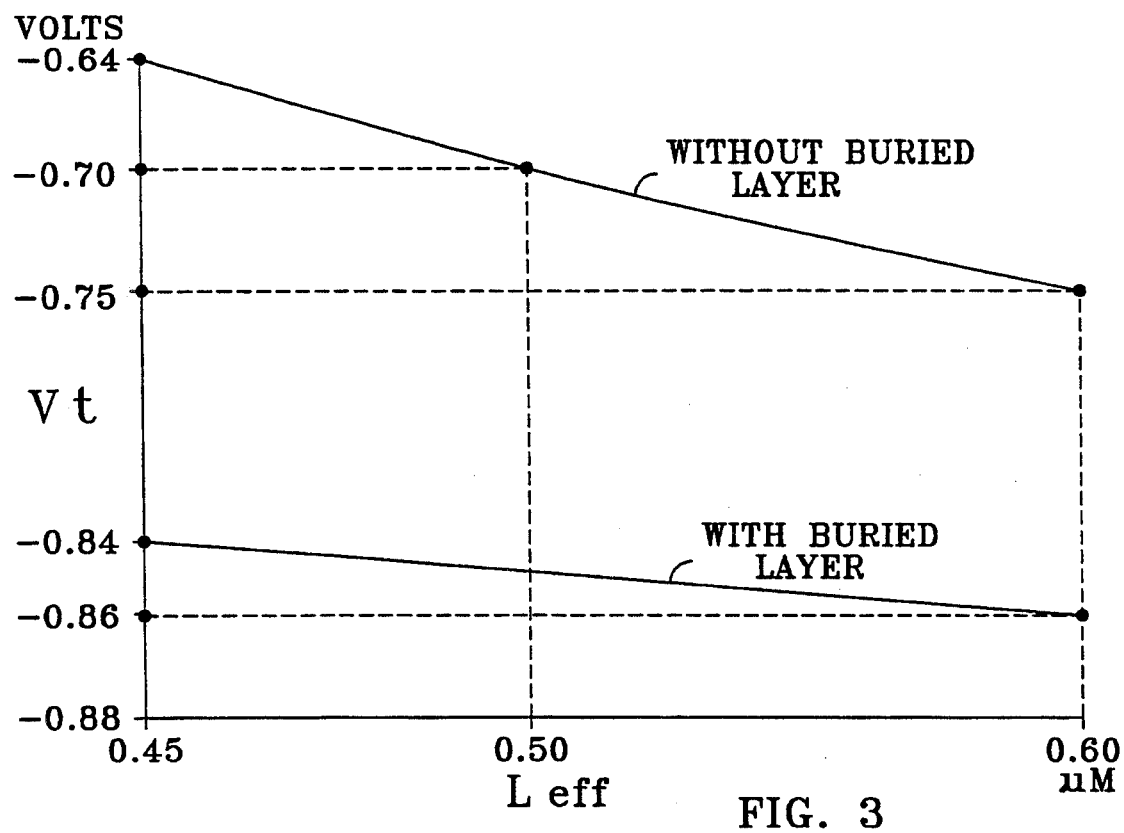
Figure 4:
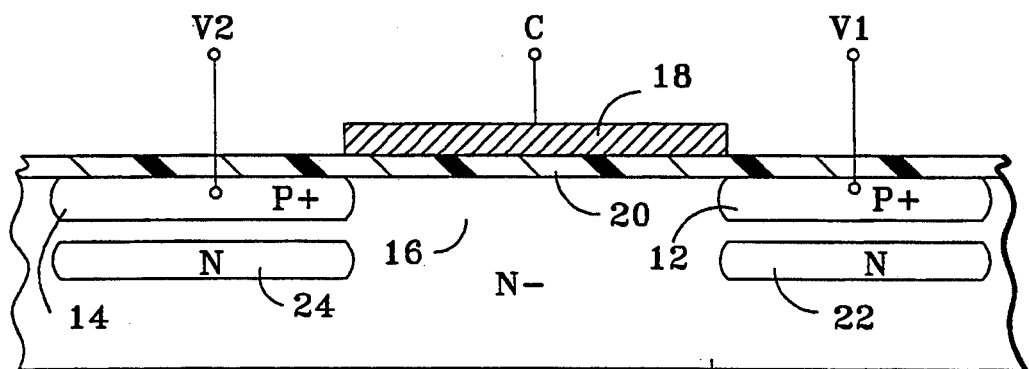

FIG. 1 is a sectional view of a short channel field effect transistor of the present invention, FIG. 2 is a graph showing curves of drain current plotted against gate-to-source voltage for a short channel transistor that uses the present invention and for a similar short channel transistor that does not use the teachings of this invention, FIG. 3 is a graph showing results of similar devices with different channel lengths in terms of threshold voltage for short channel transistors using the teachings of the present invention and and not using the teachings of the present invention, FIG. 4 is a sectional view of another short channel field effect transistor of the present invention which is a modification of the transistor illustrated in FIG. 1 of the drawings, and FIGS. 5A-5D are sectional views of a preferred method of fabricating the short channel field effect transistor of the present invention as illustrated in FIG. 1.

BEST MODE FOR CARRYING OUT THE INVENTION

Referring to FIG. 1 of the drawings in more detail, there is illustrated in a sectional view an enhancement mode short P channel field effect transistor. The transistor includes a lightly doped N type, i.e., N−, semiconductor substrate 10, preferably made of silicon, having P+ source and drain diffusions or electrodes 12 and 14, respectively, which define a channel region 16 therebetween, with a gate electrode 18 disposed over the channel region 16. A gate dielectric layer 20 is interposed between the gate electrode 18 and the channel region 16. A region 22 buried within the substrate 10 is disposed below and substantially aligned with the P+ source diffusion or electrode 12. The region 22 has a similar type dopant N to that of the substrate 10 but at a higher concentration. The substrate 10 is doped between $10^{15}$ and $10^{17}$ atoms per cubic centimeter, the source 12 and drain 14 electrodes are doped higher than $10^{19}$ atoms per cubic centimeter and the buried region 22 is doped between $10^{17}$ and $10^{19}$ atoms per cubic centimeter, which can be accomplished by known ion implant techniques using a dose range between $10^{12}$ and $10^{14}$ ions per square centimeter, or by any other known means. The depth of the peak concentration of the dopant in the region 22 for optimum operation is between 0.10 and 0.35 microns from the surface of the semiconductor substrate 10. In any event the buried region 22 has sufficient N type dopant to prevent penetration of the depletion region generated by the P+ diffusion of the source electrode 12 into the substrate 10 or at least to significantly limit the penetration of the electric field which results from the junction between the P+ diffusion of the source 12 and the N− substrate 10. The buried region 22 has the effect of limiting the effect of the fringing fields from the P−N junction between the first region 12 and the second regions 22 on the potential in the channel region 16. A control voltage C is applied to the gate electrode 18 and an electrically conductive contact is made with the source electrode 12, which may be, e.g., from a substantially fixed bias or supply voltage source B.

It can be seen that the buried region 22 in FIG. 1 acts as a termination for the electric field lines which originate from the source electrode 12, thus reducing the normal field lines which otherwise would extend into the channel region 16 from the source electrode 12. This arrangement of the invention prevents the field from the source electrode 12 from reducing the ability of electrode 18 to control the carder density in the channel region 16. The edge of the buffed region 22 must be substantially aligned with the edge of the gate electrode 18 and the edge of the source electrode 12 for the short channel transistor of the present invention to produce the desired results. If the buried region 22 extends under the gate electrode 18, then the magnitude of the threshold voltage of the transistor of FIG. 1 increases greatly as the amount of overlap is increased. The extension of the N-type buried region 22 to a position underneath the gate electrode 18 reduces the number of carriers in the channel region 16, consequently, a large magnitude of voltage must be applied to the gate electrode 18 through the terminal C in order to initiate conduction through the transistor. If the buffed region 22 does not reach or extend to the edge of the gate electrode 18, then the shielding effect of the buffed region 22 in preventing the the carriers from the source electrode 12 from diffusing into the channel region 16 is greatly reduced and the magnitude of the threshold voltage of the transistor decreases as the spacing between the source electrode 12 and the drain electrode 14 is decreased. By aligning the edge of the buried region 22 to lie substantially beneath the edge of the gate electrode 18, as indicated in FIG. 1 of the drawings, substantial improvement in the short channel performance is achieved without the loss of channel doping control over the transistor threshold voltage.

Figure 5A:
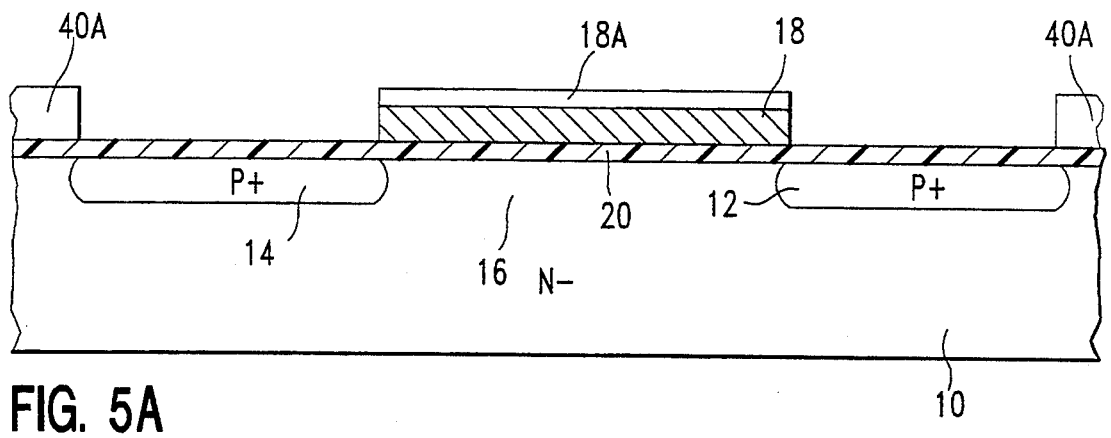
Figure 5B:
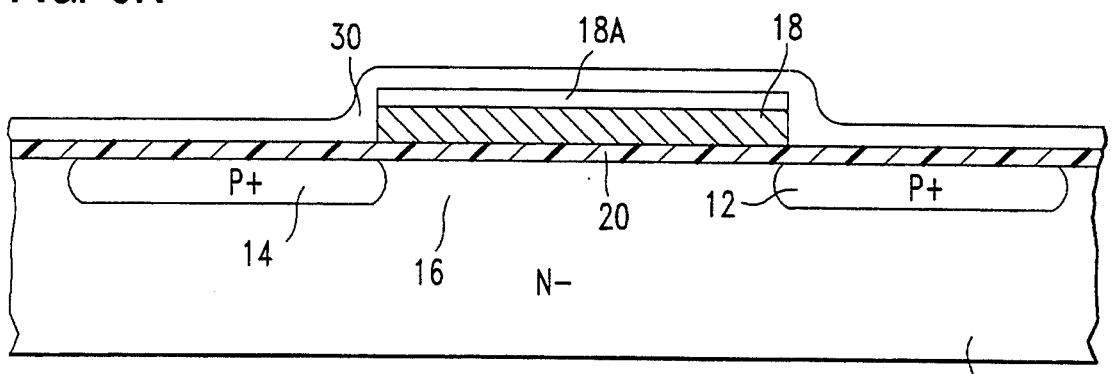
Figure 5C:
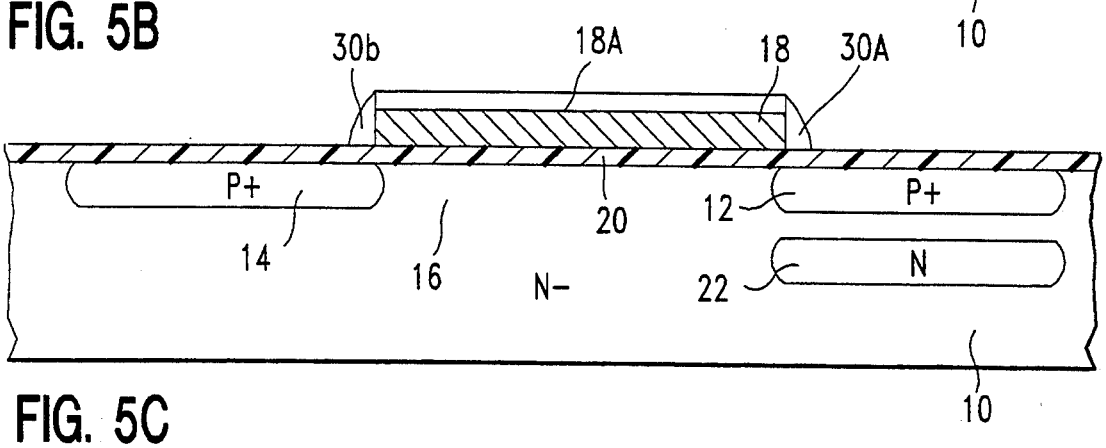

There are a number of methods or processes which can be used to fabricate the short channel transistor of the present invention illustrated in FIG. 1 of the drawings. One such method is shown in FIGS. 5A–5D and is described as follows: (1) using the gate electrode 18 as a mask (with oxide 18A on its upper surface for protection of the gate electrode), implant and diffuse the dopant ions for the source and drain electrodes 12 and 14 through a photoresist mask 40A, in the usual manner (FIG. 5A); (2) following this implantation, a "sidewall spacer" is formed on the gate electrode 18. The spacer is formed from an insulator 30 such as silicon oxide, that is chemical vapor deposited on the substrate (FIG. 5B) and subsequently anisotropically etched to leave silicon oxide 30A, 30B only along the vertical edges (or "sidewalls") of the gate electrode 18 (FIG. 5C). The formation of sidewall spacers is disclosed e.g. in U.S. Pat. No. 4,597,824, which issued on Jul. 1, 1986; (3) a photoresist mask 40B (or other suitable masking material) is then applied to mask areas of the substrate other than the source electrode 12; (4) the buffed region 22 is then formed by implantation through the combination of the gate electrode 18, sidewall spacer 30A, and the photomask 40B with the impurities and dopant concentrations as set forth hereinabove. Since the buried region 22 is implanted deeper into the semiconductor substrate 10 than are the source and drain regions 12 and 14, the edge of the buried region 22 extends laterally toward the edge of the gate electrode 18 from the edge of the sidewall spacer 30B. This lateral movement of the impurity during implantation is discussed in previously identified U.S. Pat. No. 4,101,922.

In practice, in order to precisely determine that the region 22 is aligned with region 12, a series of tests would be conducted. First the threshold voltage of the device shown in FIG. 1 would be compared to that of a device that undergoes exactly the same processing, but without the buried region 22. This second device would have a much longer channel length (on the order of two microns). If the buried region 22 extends beyond source 12 into the portion of the substrate beneath the channel region 16, the threshold voltage of the device with the buried region 22 will be greater than that of the long channel test device, because now the buried region 22 would be disturbing the electric field that induces conduction in the channel region 16. Second, the threshold voltages of devices (all having the buffed region 22) with different channel lengths (e.g. lengths of 0.5, 1.0, 1.5, and 2 microns, respectively) would be compared. One of the main purposes of the buffed region is to provide a threshold voltage characteristic for short channel transistors that is the same as longer channel devices. So, the threshold characteristics should be substantially independent of channel length. If the buffed region 22 does not fully extend beneath the source 12 (that is, if region 12 extends further beneath the gate than region 22), then these threshold curves will differ.

Using the results of these tests, the lateral dimensions of the buried region 22 can be optimized by varying the thickness of the chemical vapor deposited layer 30 to produce sidewall spacers 30A, 30B on the edges of the gate electrode 18 of different thicknesses or widths and/or by varying the implant energy or the heating cycle that drives the dopants into the substrate.

Referring in more detail to FIG. 2 of the drawings, there can be seen in the graph the current Id, normalized to units of $4 \times 10^{-8}$ amperes for a transistor having a channel width equal to its channel length, at the drain electrode 14 of short P channel field effect transistors plotted on a log scale against the gate-to-source voltage Vgs, in volts, for transistors having an effective channel length Leff of 0.45 microns, one of the transistors using the buried region 22 of the present invention and another transistor being without the use of the buried region. The threshold voltages of the transistors are determined at the drain electrode current of 40 nanoamperes. It can be seen that at 40 nanoamperes the threshold voltage of the short channel transistor with the buried region 22 of the present invention is −0.84 volts, whereas the threshold voltage of the short channel transistor without the buried region is only −0.64 volts. These results have been obtained by using well known device simulation programs for solving Poisson's equations which also calculate device current.

It also has been found that with the use of the present invention for short channel transistors the threshold voltage change is significantly smaller with changes in channel length compared with short channel transistors that do not use the present invention. Referring to FIG. 3 of the drawings, wherein the effective length Leff between the source 12 and drain 14 electrodes of short channel transistors is plotted against threshold voltage Vt, it can be seen that with the use of the buried region 22 as taught by the invention, the threshold voltage was found to be only 20 millivolts higher for a transistor having a 0.45 micron channel length than for a transistor having a 0.60 micron channel length, whereas without the use of the present invention the threshold voltage increase was 110 millivolts between a 0.60 micron channel length and a 0.45 micron channel length. The reduction of the short channel effect from 110 millivolts without the use of the present invention to 20 millivolts with the use of the invention was produced with no changes made in the doping distribution or electric field at the drain electrode of the field effect transistor, thus, the improvement was obtained without degrading the hot carrier characteristics of the transistor which would result if additional doping were placed near the drain electrode 14.

The buried region 22 and the source diffusion 12 can both be very heavily doped and immediately adjacent to each other provided that the source diffusion 12 and the substrate 10 are operated at the same potential, i.e., at zero substrate bias, which is generally the case in logic circuits. If the source diffusion 12 and the substrate 10 are operated at different potentials, then the minimum thickness of the depletion region between the source diffusion 12 and the buried region 22 is determined by well known avalanche and tunneling conduction mechanisms. Of course, it is undesirable to have excess leakage current between the source electrode 12, or the drain electrode 14, and the substrate 10 during normal operation of the transistor.

An aspect of the present invention is that the capacitance between the source diffusion 12 and the substrate 10 is significantly increased. Thus, in general, the buried region 22 is preferred in circuits which are insensitive to the increase in capacitance, e.g., when the source diffusion is connected to a supply voltage terminal Vdd or Vss. There are exceptions where the incorporation of additional capacitance improves circuit operation, e.g., at drain electrodes in cross-coupled static random access memory cells where additional capacitance enhances cell stability to soft errors.

It should be understood that in the present invention the threshold voltage of the transistor is controlled principally by the channel tailor doping, gate dielectric thickness and gate electrode work function. The purpose of the buried region 22 beneath the source diffusion 12 is to limit the spacial extent of the electric fields which result from the junction between the source diffusion 12 and the substrate 10. It is the lateral fringing component of these fields which reduces the threshold voltage of short channel length transistors.

It should be noted that the lateral extent of the fringing fields of the two essentially parallel electrodes 12 and 22 is proportional to the spacing between the electrodes 12 and 22. Thus, by confining the depletion region to the space between the buried region 22 and the source diffusion 12 by making the buried region 22 substantially aligned to the edge of the source diffusion 12, particularly at the edge of the channel region 16, the unwanted fringing fields in the channel region 16 are significantly reduced. As fringing fields are to a first order proportional in lateral extent to the depth, the effect of diffusion potential on the channel potential distribution likewise is reduced.

When the present invention is practiced on a drain electrode of a transistor, the drain bias threshold reduction and subthreshold leakage, millivolts/decade, are similarly reduced. When the present invention is practiced on the source electrode of a transistor, the short channel effect is reduced due to the reduction of fringing from the built in junction potential.

Figure 5D:
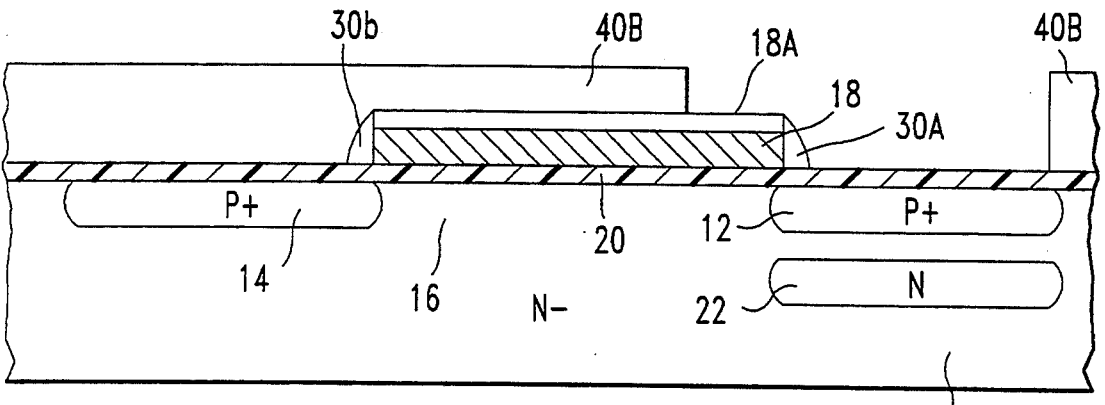

Referring to FIG. 4 of the drawings in more detail, wherein similar elements to those illustrated in FIG. 1 have the same reference numbers, there is shown in a sectional view an enhancement mode short P channel field effect transistor in accordance with the teachings of the present invention which is similar to the short channel transistor illustrated in FIG. 1 of the drawings but wherein a buried region 24 is added under the drain electrode 14 and aligned therewith. The buried region 24 is similar in all respects to the buried region 22 disposed under the source electrode 12 including a diffusion having the same type dopant. The process for making the buried layer 24 under the drain 14 is similar to that used for making the buffed layer 22 under the source electrode 12. Of course, the photoresist mask 40B used to limit the buried region implant would be patterned differently than as shown in FIG. 5D, to permit implantation of the impurities to form both the buffed layers 22 and 24 under the source and drain electrodes 12 and 14, respectively. The transistor of FIG. 4 is particularly useful in, e.g., a cell of a static random access memory wherein the drain electrode 14 is connected to a storage node V2 of the cell and the source electrode 12 is connected to a point of reference potential V1, such as a power supply, to improve the stability of the cell with added capacitance.

Although FIGS. 1 and 4 illustrate the present invention with a P channel field effect transistor, it should be understood that the invention also applies to an N channel field effect transistor by simply reversing dopant types and voltage polarities in the transistor. It should also be understood that a well of lightly doped material of opposite conductivity to that of the semiconductor substrate 10 in which the well may be supported should also be considered as a semiconductor substrate in which this invention may be practiced. Accordingly, the substrate 10 with a well therein (not shown) may contain both P channel and N channel field effect transistors of the type taught by the present invention. It should be further understood that implantation of ions into the semiconductor substrate may be made by known placement techniques such as by the use of temporary masking materials and spacers as discussed hereinabove.

While the invention has been particularly shown and described with reference to preferred embodiments thereof, it will be understood by those skilled in the art that various changes in form and details may be made therein without departing from the spirit and scope of the invention.

What is claimed is:

1. A short channel field effect transistor comprising
a semiconductor substrate having a given surface and a given type dopant, a source electrode disposed within said semiconductor substrate, said source electrode having a dopant of a type opposite to the given type dopant and an edge, said source electrode generating a depletion region penetrating into said semiconductor substrate, a channel disposed in said semiconductor substrate adjacent to said source electrode providing a source electrode-channel interface at the edge of said source electrode, a region disposed below said source electrode within said semiconductor substrate having the same type dopant as that of said semiconductor substrate and an edge, the edge of said region being aligned along a line perpendicular to the given surface of said semiconductor substrate with the source electrode-channel interface, said region having a higher dopant concentration than that of the dopant of said semiconductor substrate sufficient to substantially prevent penetration of the depletion region generated by said source electrode into said semiconductor substrate, and a supply voltage terminal coupled to said source electrode.

2. A short channel field effect transistor as set forth in claim 1 wherein said source electrode is a diffusion region disposed at the surface of said semiconductor substrate.

3. A short channel field effect transistor as set forth in claim 2 wherein said source electrode is disposed between said given region and the surface of said semiconductor substrate.

4. A short channel field effect transistor comprising a semiconductor substrate having a given surface and a given type dopant with a dopant concentration between $10^{15}$ and $10^{17}$ atoms per cubic centimeter, a source electrode including a diffusion region disposed within said semiconductor substrate at the surface thereof, said source electrode having a dopant of a type opposite to the given type dopant with a dopant concentration higher than $10^{19}$ atoms per cubic centimeter and an edge, said source electrode generating a depletion region penetrating into said semiconductor substrate, a channel disposed in said semiconductor substrate adjacent to said source electrode providing a source electrode-channel interface at the edge of said source electrode, a given region disposed below said source electrode within said semiconductor substrate having the same type dopant as that of said semiconductor substrate and an edge, the edge of said given region being aligned along a line perpendicular to the given surface of said semiconductor substrate with the source electrode-channel interface, said given region having sufficient dopant concentration between $10^{17}$ and $10^{19}$ atoms per cubic centimeter to substantially prevent penetration of the depletion region generated by said source electrode into said semiconductor substrate, said source electrode further being disposed between said given region and the surface of said semiconductor electrode, and a supply voltage terminal coupled to said source electrode.

5. A short channel field effect transistor as set forth in claim 4 wherein said given region has a depth of peak dopant concentration between 0.1 and 0.35 microns from the surface of said semiconductor substrate.

6. A short channel field effect transistor as set forth in claim 5 wherein the peak dopant concentration of said given region is spaced from said source electrode.

7. In a field effect transistor having a channel less than 0.5 microns, a semiconductor substrate having a planar surface and a given type dopant, an electrode diffusion having an edge disposed in said semiconductor substrate, said electrode diffusion generating a depletion region penetrating into said semiconductor substrate, a region having an edge and the same type dopant as that of said semiconductor substrate disposed beneath said electrode diffusion in said semiconductor substrate, the edge of said region and the edge of said electrode diffusion being aligned substantially along a line perpendicular to the planar surface of said semiconductor substrate, said region having a higher dopant concentration than that of the dopant of said semiconductor substrate sufficient to prevent penetration of the depletion region generated by said electrode diffusion into said semiconductor substrate, an electrical conductor connected to said electrode diffusion, and means for applying a voltage to said electrical conductor.

8. In a field effect transistor having a channel length less than 0.5 microns as set forth in claim 7 wherein said voltage applying means applies a constant voltage to said electrical conductor.

9. In a field effect transistor having a channel length less than 0.5 microns as set forth in claim 7 wherein said electrode diffusion and said region are spaced apart.

10. A short channel field effect transistor comprising a semiconductor substrate having a given type dopant, a conductive gate electrode insulated from a surface of said semiconductor substrate, source and drain electrodes disposed within said semiconductor substrate at the surface thereof, said source electrode having an edge aligned with a first edge of said conductive gate electrode, said source and drain electrodes having a dopant of a type opposite to that of the given type dopant and said source electrode generating an electric field penetrating into said semiconductor substrate, a region disposed in said semiconductor substrate having the same type dopant as that of said semiconductor substrate, said region having an edge aligned along a line perpendicular to the surface of said semiconductor substrate with the first edge of said conductive gate electrode, and said region having a higher dopant concentration than that of the dopant of said semiconductor substrate sufficient to at least significantly limit the extent of the electric field penetration into said semiconductor substrate resulting from a junction located between said source electrode and said semiconductor substrate, and an electrical conductor connected to said source electrode.

11. A short channel field effect transistor as set forth in claim 10 further including means for applying a substantially constant voltage to said electrical conductor.

12. A short channel field effect transistor as set forth in claim 10 further including a channel having a length less than 0.5 microns disposed in said semiconductor substrate between said source and drain electrodes and having one end thereof aligned with the edge of said region.

13. A short channel field effect transistor comprising
a semiconductor substrate having a given type dopant with a dopant concentration between $10^{15}$ and $10^{17}$ atoms per cubic centimeter,
a conductive gate electrode insulated from a surface of said semiconductor substrate,
source and drain electrodes disposed within said semiconductor substrate at the surface thereof, said source electrode having an edge aligned with a first edge of said conductive gate electrode, said source and drain electrodes having a dopant of a type opposite to that of the given type dopant and said source electrode having a dopant concentration higher than $10^{19}$ atoms per cubic centimeter, said source electrode generating an electric field penetrating into said semiconductor substrate,
a region disposed in said semiconductor substrate having the same type dopant as that of said semiconductor substrate, said region having an edge aligned along a line perpendicular to the surface of said semiconductor substrate with the first edge of said conductive gate electrode, and said region having sufficient dopant concentration between $10^{17}$ and $10^{19}$ atoms per cubic centimeter to at least significantly limit the extent of the electric field penetration into said semiconductor substrate resulting from a junction located between said source electrode and said semiconductor substrate, said source electrode being further disposed between said region and the surface of said semiconductor substrate,
a channel having a length less than 0.5 microns disposed in said semiconductor substrate between said source and drain electrodes and having one end thereof aligned with the edge of said region, and
an electrical conductor connected to said source electrode.

14. A short channel field effect transistor as set forth in claim 13 wherein the peak concentration of the dopant of said region is located between 0.1 and 0.35 microns from the surface of the semiconductor substrate.

15. A short channel field effect transistor as set forth in claim 14 wherein said source electrode and said region are spaced apart.

16. A short channel field effect transistor as set forth in claim 14 wherein said channel and said drain electrode provide a drain electrode-channel interface and further including a second region having the same type dopant as that of said semiconductor substrate, an edge of said second region being aligned along a second line perpendicular to the surface of said semiconductor substrate with the drain electrode at the drain electrode-channel interface and with a second edge of said conductive gate electrode, said second region having sufficient dopant to at least significantly limit the extent of the electric field penetration resulting from the junction between said drain electrode and said semiconductor substrate and a second electrical conductor connected to said drain electrode.

17. A short channel field effect transistor as set forth in claim 16 wherein said drain electrode is spaced from said second region.

* * * * *